United States Patent [19]
Greco et al.

[11] Patent Number: 5,472,351
[45] Date of Patent: Dec. 5, 1995

[54] PERSONAL COMPUTER MODEM CARD INTERFACE CONSTRUCTION

[75] Inventors: Gerald A. Greco, Batavia; Bernard G. Sepaniak, Jr., Lake Zurich, both of Ill.

[73] Assignee: U.S. Robotics, Inc., Skokie, Ill.

[21] Appl. No.: 132,743

[22] Filed: Oct. 6, 1993

[51] Int. Cl.⁶ .................................................. H01R 13/627
[52] U.S. Cl. .......................... 439/353; 439/358; 235/492
[58] Field of Search ................................. 439/350, 353, 439/357, 259, 260, 629, 633, 651, 652, 352, 358; 235/492, 487, 443

[56] References Cited

U.S. PATENT DOCUMENTS

| | | | |
|---|---|---|---|
| 2,760,174 | 8/1956 | Burtt et al. | 439/358 |
| 5,016,086 | 5/1991 | Inoue et al. | 435/492 |
| 5,030,128 | 7/1991 | Herron et al. | 439/352 |
| 5,051,101 | 9/1991 | Komatsu | 439/350 |
| 5,155,663 | 10/1992 | Harase | 439/352 |
| 5,244,397 | 9/1993 | Anhalt | 439/101 |

*Primary Examiner*—Larry I. Schwartz
*Assistant Examiner*—Hien D. Vu
*Attorney, Agent, or Firm*—Banner & Allegretti, Ltd.

[57] ABSTRACT

A construction for an interface between a computer and a transmission medium, such as a telephone line. A memory card may be inserted into the computer and interconnected to an interface module, such as a direct access arrangement, which, in turn, is interconnected to a telephone line. The electronic card and interface module each include a connector for transmitting data signals between each other. Each connector includes two rows of contacts. Each contact in the first row is interconnected to a particular contact in the second row. As a result, the electronic card and interface module cannot be attached to each other "upside down." Further, the electronic card and interface module cooperatively define a latch mechanism for releasably holding the two units together. Further, the two units further define a guide assembly for guiding the contacts of the two units into a correct alignment with one another. The latch mechanism and guide assembly add structural integrity to the construction. Accordingly, there is a lower risk that the electronic card and interface module will be unintentionally pulled apart.

4 Claims, 4 Drawing Sheets

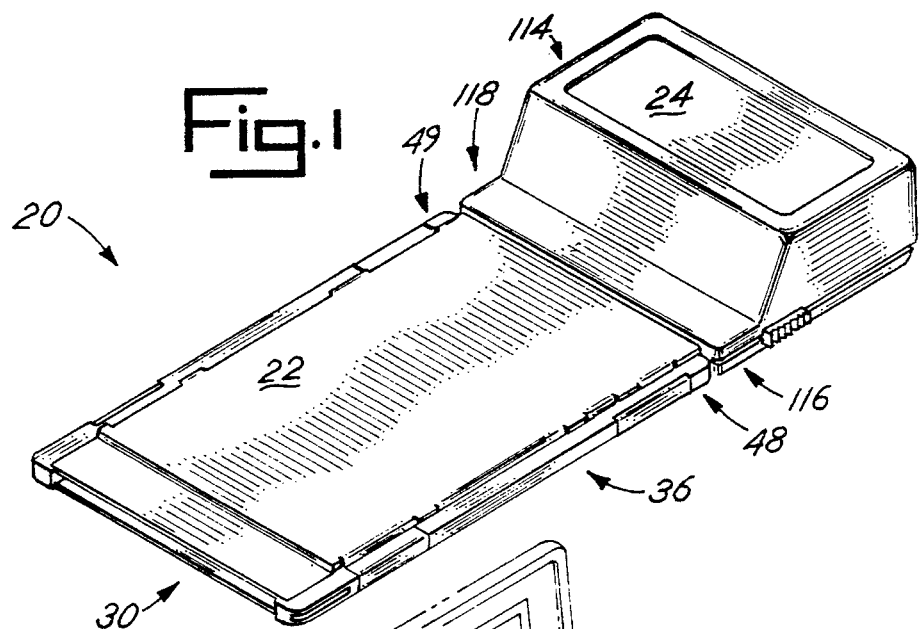
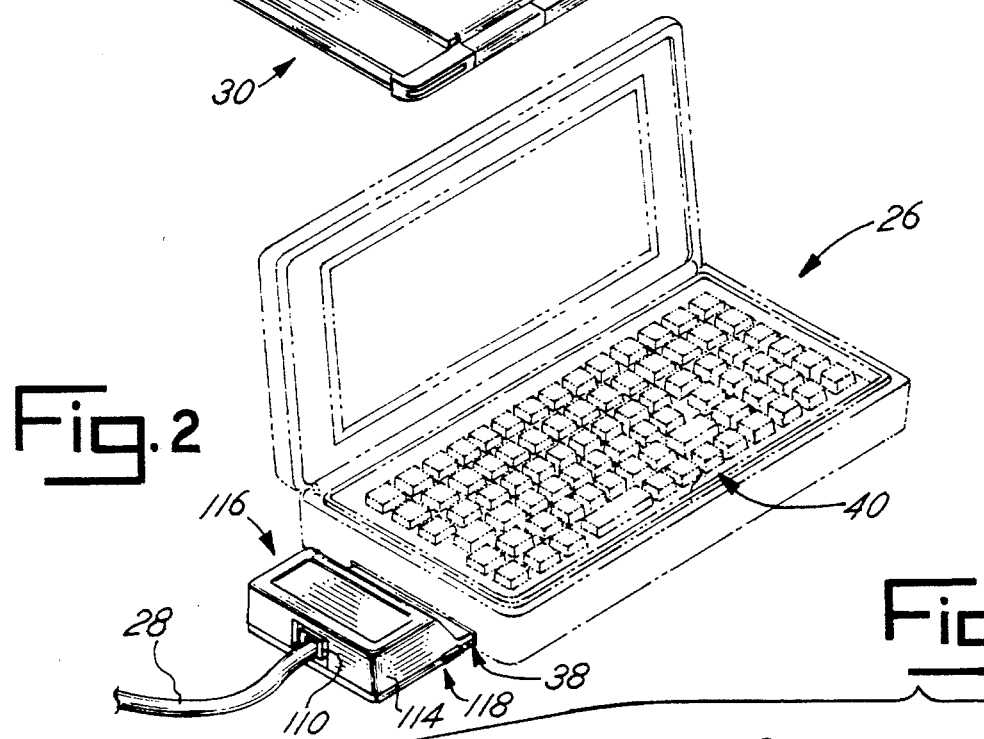
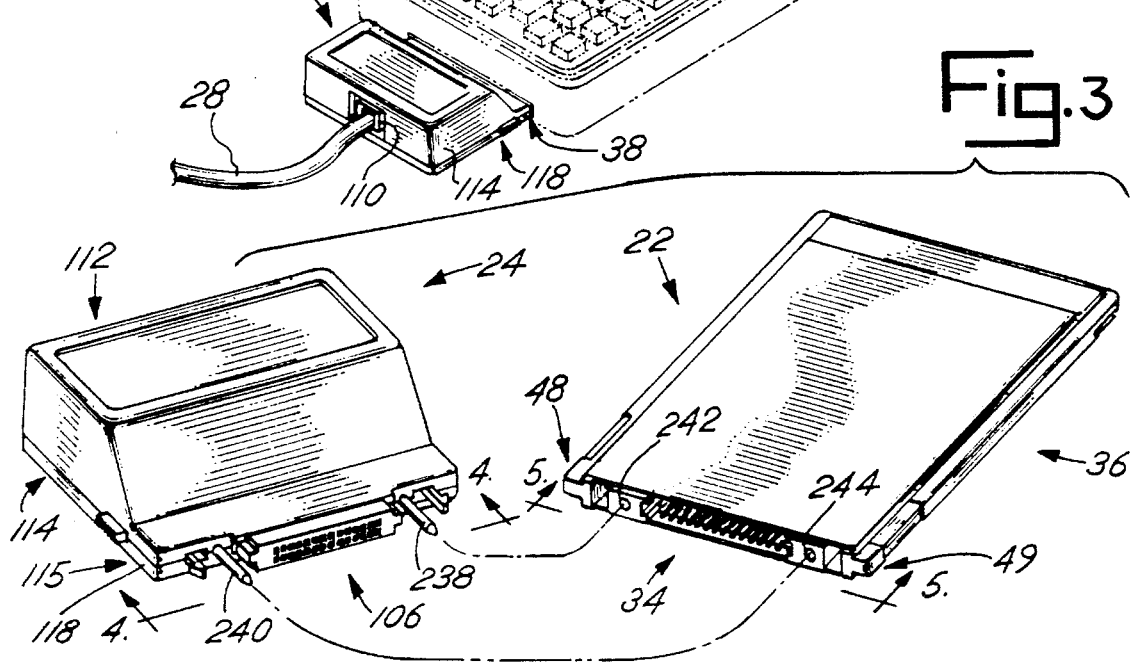

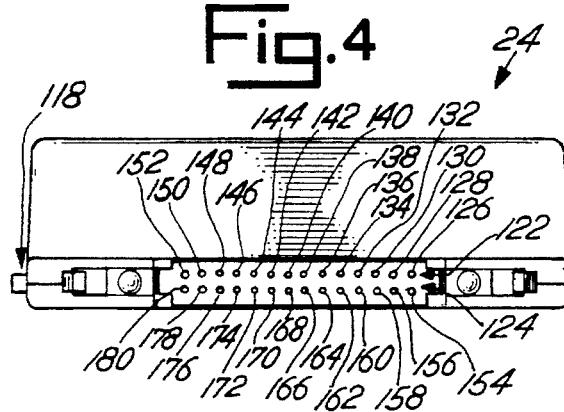
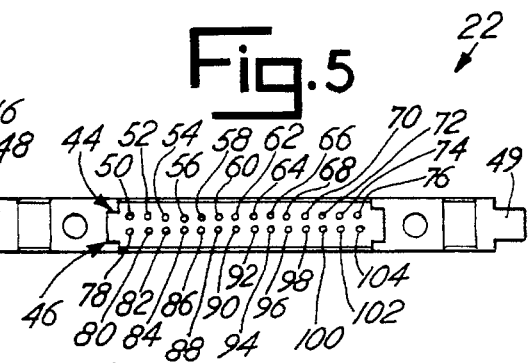
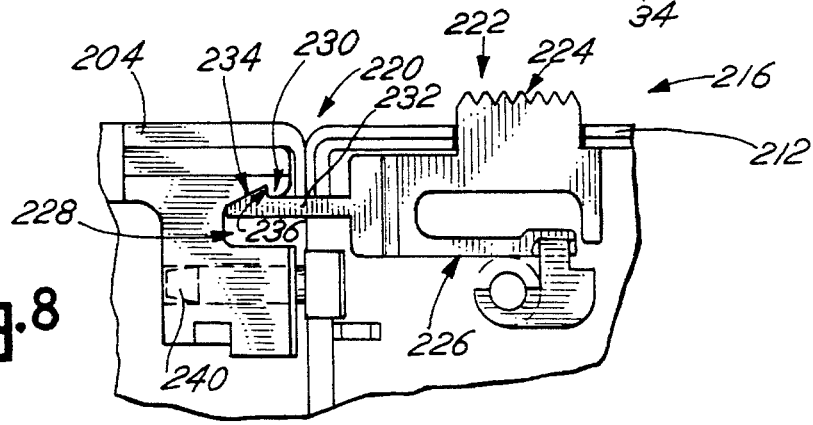
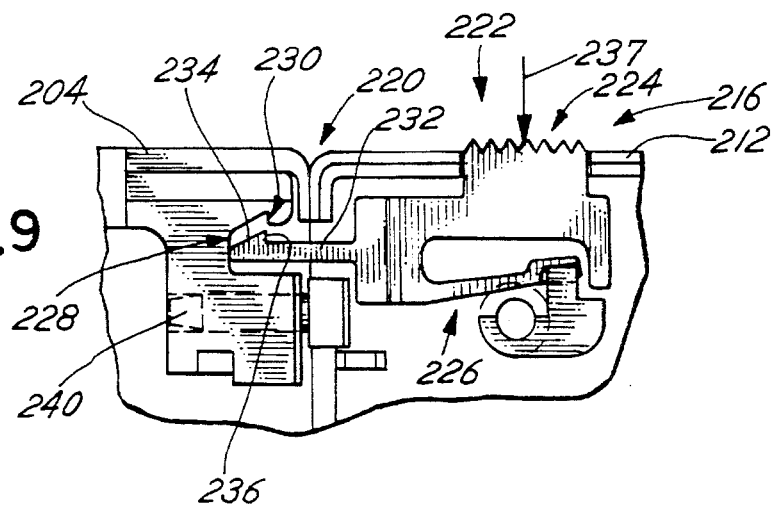

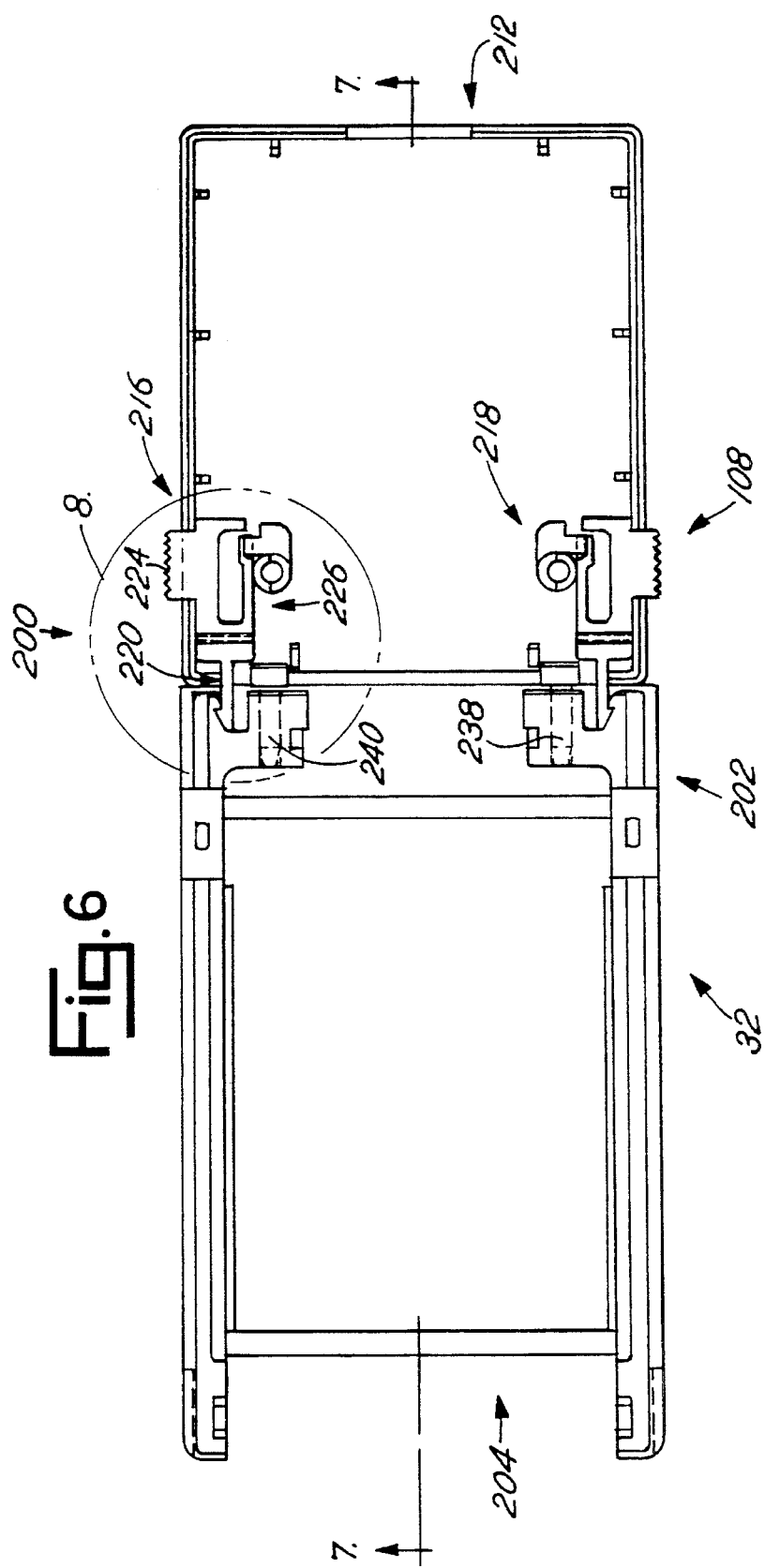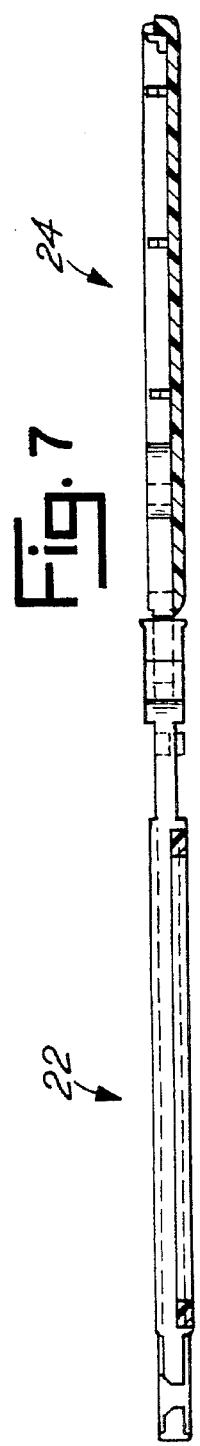

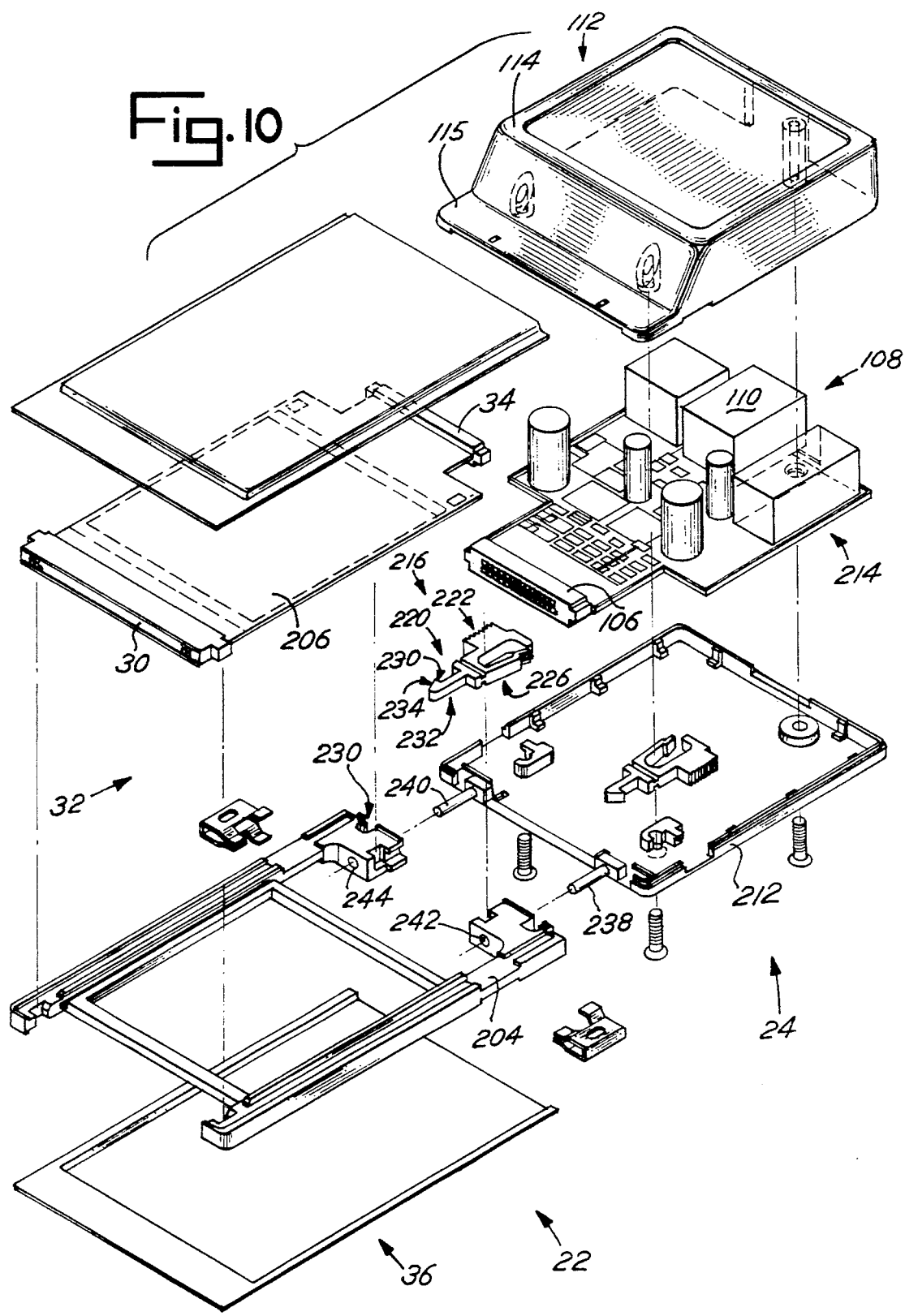

PERSONAL COMPUTER MODEM CARD INTERFACE CONSTRUCTION

BACKGROUND OF THE INVENTION

The present invention relates generally to the construction of interfaces between computers and data transmission media and, more particularly, to a construction for an interface interconnecting a Personal Computer Modem Card ("PCMC") with a telephone line or other transmission medium.

A presently available interface between a "personal" computer and a telephone line may include a (1) Personal Computer Modem Card, (2) length of cable, and (3) Data Access Arrangement. The Personal Computer Modem Card may also be referred to as a "PCMC," "Personal Computer Modem Card International Association card," "PCMCIA card," "PCM card," or, simply, "modem card." The Data Access Arrangement may also be referred to as a "Direct Access Arrangement," "DAA," PSTN INTERFACE," or, simply, "access arrangement."

The PCMC includes a computer socket and cable connector and may slide into an access opening of the computer. The computer socket of the PCMC matingly engages a corresponding socket in the computer. The cable connector on the PCMC is attached to one end of the length of cable. Data from the computer is received by the PCMC through the socket, modulated, and then transmitted through the length of cable.

The DAA is interconnected to the cable and includes an RJ style jack (such as an RJ11 jack) interconnected to the telephone line. The DAA receives signals via the cable and responsively transmits a data signal, through the jack, onto the telephone line. Signals from the telephone line to the computer flow, of course, in the opposite direction.

The DAA also provides a degree of electrical isolation for the PCMC and computer. If the voltage along the telephone line should spike to a high level (as might happen if lightening should strike the telephone network), the voltage at the DAA's cable connector would still be relatively low. As a result, the PCMC and computer would be protected from damage by the voltage surge.

The length of cable between the PCMC and DAA may extend for a foot or more. Such an arrangement (sometimes colloquially described in the United States as a "soap on a rope" interface) is found by many manufacturers to be relatively difficult and expensive to mass produce. Further, such an arrangement may be unreliable in providing a continuous physical interconnection between a computer and a telephone line. For example, the weight of the DAA and cable may exert pressure on the PCMC, physically pulling the cable away from the PCMC cable connector.

Further, such an arrangement is bulky. Many users choose to work with portable computers because of their low weight, small size, and easy portability. A large cable and DAA assembly makes a computer and its related equipment less portable and, thus, less useful to the person employing the computer.

Furthermore, many prior art mechanisms may be connected improperly to the computer. For example, the cable may be improperly attached to the fragile PCMC, or the DAA may be improperly connected to the cable. Such incorrect connections obviously prevent the computer from communicating with the telephone network until the miss-connection is noted and changed. In an extreme case, an improper connection may damage the computer. Many presently available mechanisms also lack a reliable system for guiding the cable, DAA, and PCMC into a correct alignment for firmly, but releasably, ensuring that the PCMC and DAA are kept in communication with each other.

SUMMARY OF THE INVENTION

In a principal aspect, the present invention is a construction for an interface between a computer and a data transmission medium, such as a telephone line. The computer receives an electronic card, such as a modem card. An interface module, such as an access arrangement, is interconnected to the transmission medium. The invention includes an interface interconnecting the card and interface module.

In one embodiment, the card and interface module each include connectors. Each connector includes two rows of contacts. A first row of contacts is ordered in a sequence of 1, 2 . . . N, starting from a common side of the modem card and access arrangement. The second row of contacts is ordered in a reverse sequence. Like-numbered contacts are electrically interconnected. As a result, the interface module cannot be inserted "upside down" with respect to the card.

In another embodiment, the card and interface module include a guide pin assembly. The card and interface module may each be considered one of a pair of interface units. Two pins extending from one of the interface units are received by two corresponding apertures in the other interface unit. The guide pin assembly guides the interface module into proper alignment with the card when a user presses the interface module and card together.

In yet another embodiment of the invention, the interface units also include a latching mechanism. A catch extends from one of the interface units and is received by a corresponding aperture in the other interface unit. When the interface module is pressed onto the card sufficiently, the latch mechanism locks, such that the interface module may not be removed from the card, unless the latch mechanism is released. Moreover, the guide pin assembly and latching mechanism support the interface module when an external force is directed against it.

In a further embodiment, the latching mechanism includes a spring, urging the catch toward a normal position. When the card and interface module are pressed together sufficiently, the spring urges the catch toward a normal position. Such movement of the catch by the spring releasably locks the card and interface module together, as well as giving acoustic feedback to the user, indicating that the card and interface module have been sufficiently pressed together to establish a connection.

Thus, an object of the present invention is an improved construction for an interface between a computer and data transmission medium. Another object is a more compact interface construction that more reliably establishes a connection between a personal computer and a telephone line. Yet another object is a construction that is easier and less expensive to manufacture. Still a further object is a construction that is less likely to be incorrectly assembled by a computer user.

A further object is a construction that is smaller, while still withstanding greater external forces brought against it from all directions. Still yet another is an improved construction that provides better auditory feedback when the interface components have been sufficiently pressed together. These and other objects, features, and advantages of the present invention are discussed or apparent in the following detailed

BRIEF DESCRIPTION OF THE DRAWINGS

The preferred embodiment of the present invention is described herein with reference to the drawings wherein:

FIG. 1 is an isometric view of the preferred embodiment of the present invention;

FIG. 2 is an isometric view of the preferred embodiment shown in FIG. 1 used in conjunction with a personal computer;

FIG. 3 is an isometric view of the connectors of the modem card and access arrangement shown in FIG. 1;

FIG. 4 is a side view of the connector in the access arrangement shown in FIG. 3, taken along line 4—4;

FIG. 5 is a side view of the connector in the modem card shown in FIG. 3, taken along line 5—5;

FIG. 6 is a top, cross-sectional view of the preferred embodiment shown in FIG. 1;

FIG. 7 is a cross-sectional view of the preferred embodiment shown in FIG. 6, taken along line 7—7;

FIG. 8 is an expanded, top view of the latch of the preferred embodiment shown in FIG. 6, with the latch in a locked position;

FIG. 9 is an expanded, top view of the latch of the preferred embodiment shown in FIG. 6, with the latch in an unlocked position; and FIG. 10 is an exploded view of the preferred embodiment shown in FIG. 1.

DETAILED DESCRIPTION OF THE PREFERRED EMBODIMENT

Referring to FIGS. 1–10, the present invention is an interface 20 cooperatively defined by an electronic card, such as a modem card 22, and an interface module, such as an access arrangement 24. As shown in FIGS. 1–3, the modem card 22 interconnects to a computer 26. The access arrangement 24 is connected between the modem card 22 and a telephone line 28.

The modem card 22 includes a socket 30, central components 32, connector 34, and external case 36. See FIGS. 1–3 and 10. The computer 26 includes an access opening 38 for the modem card 22, an interface keyboard 40, and a socket (not shown) to matingly engage the socket 30 of the modem card 22. Thus, the modem card 22 may be placed in the opening 38 of in the computer 26, as shown in FIG. 2, and inserted into the socket of the computer 26.

The connector 34 of the modem card 22 is disposed toward the opening 38 in the computer 26. In the preferred embodiment shown, the modem card 22 includes a plurality of pins, or contacts 42, extending toward the opening 38 and access arrangement 24. See FIG. 5. The pins 42 extend from the modem card 22 in first and second rows 44, 46. The case 36 includes at least first and second opposing sides 48, 49 on either end of the two rows 44, 46 of pins 42.

As shown in FIG. 5, in the preferred embodiment, each of the rows 44, 46 includes fourteen pins. Choosing, for example, the first side 48 of the case 36, the pins 42 in the first row 44 may be considered as being numbered in the sequence of one 50, two 52, three 54, four 56, five, 58, six 60, seven 62, eight 64, nine 66, ten 68, eleven 70, twelve 72, thirteen 74, fourteen 76. (Each of the pins, numbered one through fourteen, is followed by the number also identifying it in FIG. 5.) The numerical representation of the pins 42 may alternatively be described by 1, 2, ... N, where, in the preferred embodiment, N is 14. Of course, a greater or smaller number of pins 42 may be used. The pins 42 of the second row 46, starting from the same first side 48 of the modem card 22, may be numbered as fourteen 78, thirteen 80, twelve 82, eleven 84, ten 86, nine 88, eight 90, seven 92, six 94, five 96, four 98, three 100, two 102, one 104, or, alternatively, N, N–1 . . . 1.

Thus, the first pin 50 of the first row 44 and the fourteenth pin 78 of the second row 46 are adjacent each other. Similarly, the fourteenth pin 76 of the first row 44 and the first pin 104 of the second row 44 are also adjacent each other.

Like-numbered pins on the modem card 22 are electrically interconnected within the modem card 22. Thus, the first pin 50 of the first row 44 and the first pin 104 of the second row 46 are electrically interconnected, as are all other similarly number pins of the first and second rows 44, 46.

The modem card 22 and access arrangement 24 are directly interconnected to one another. The modem card 22 and access arrangement 24 may each be considered one of a pair of complimentary interface units.

The access arrangement 24 has a connector 106 to matingly engage the connector 34 of the modem card 22. The access arrangement 24 further includes central components 108 and a telephone jack 110, such as an RJ11 jack, which may interconnect to the telephone line 28. Finally, the access arrangement 24 also includes a case 112 having a raised portion 114, thin portion 115, and first and second opposing sides 116, 118 on either side of the connector 106. The first side 48 of the modem card 22 and the first side 116 of the access arrangement 24 are adjacent each other when the two interface units are connected together, as shown in FIG. 1. Accordingly the two first sides 48, 116 define a "common side" of the interface construction 20. Similarly, the two second sides 49, 118 are adjacent each other, as shown in FIG. 1, and define another "common side" of the interface.

The access arrangement connector 106 has a set of pin apertures, or contacts, 120 to matingly receive the pins 42 of the modem card 22. As shown in FIG. 4, in the preferred embodiment, the pin apertures 120 of the access arrangement 24 are also arranged in first and second rows 122, 124. The "first" row 122 of apertures 120 is the row that receives the first row 44 of pins 42. The "second" row 124 of apertures 120 receives the second row 46 of pins 42.

Again, the apertures 120 of the first row 122 can be considered as being sequentially numbered as follows, starting from the first side 116: one 126, two 128, three 130, four 132, five 134, six 136, seven 138, eight 140, nine 142, ten 144, eleven 146, twelve 148, thirteen 150, and fourteen 152. Starting from the same first side 116, the second row 124 can be considered as being numbered: fourteen 154, thirteen 156, twelve 158, eleven 160, ten 162, nine 164, eight 166, seven 168, six 170, five 172, four 174, three 176, two 178, one 180. Again, for example, the first aperture 126 of the first row 122 and the fourteenth aperture 154 of the second row 124 are adjacent each other, as are the fourteenth aperture 152 of the first row 122 and the first aperture 180 of the second row 124.

Like-numbered apertures on the access arrangement 24 are electrically interconnected within the access arrangement 24. Thus, for example, the first aperture 126 of the first row 122 and the first aperture 180 of the second row 124 are electrically interconnected.

When the modem card 22 and access arrangement 24 are interconnected, a pin with a particular number is always is inserted into a like-numbered aperture. The first pins 50, 104 of the modem card 22 and the first apertures 126, 180 of the access arrangement 24 are all interconnected when the connectors 34, 106 of the modem card 22 and access arrangement 24 are engaged.

Accordingly, the access arrangement 24 and modem card 22 cannot be interconnected "upside down." They will properly communicate when the access arrangement 24 is interconnected with the raised portion 114 extended toward the computer keyboard 40, as shown in FIG. 2, or if it were rotated 180°, such that the raised portion 114 would extend away from the keyboard 40.

As shown in FIGS. 6–10, the central components 32, 108 of the modem card 22 and access arrangement 24 cooperatively define a latch mechanism 200 and guide assembly 202. The central components 32 of the modem card 22 further include a frame 204 and electrical circuit board 206. The central components 108 of the access arrangement 24 include a frame 212 and electrical components 214.

The latch mechanism 200 includes first and second substantially similar latches 216, 218. The latch 216 is described to illustrate the operation of both latches 216, 218. The latch 216 includes a protruding catch 220 and a button assembly 222. The button assembly 222 includes a manually operable button 224 and as well as a spring 226. In the preferred embodiment, the button assembly 222 is molded from a unitary piece of plastic.

The frame 204 lends physical rigidity to the modem card 22. The frame 204 of the modem card 22 also includes an aperture 228 to receive the catch 220.

The aperture 228 is adjacent, and partially defined by, a ledge 230 in the frame 204 of the modem card 22. The catch 220 includes a stem 232, wedge 234, and shelf 236. When the catch 220 is inserted into the aperture 228, the wedge 234 rides against the ledge 230, and the catch 220 is moved from its normal position. The spring 226 is thus placed under increased tension. When the catch 220 is inserted sufficiently into the aperture 228, the spring 226 presses the catch 220 back toward a normal position. The stem 232 strikes the ledge 230 of the modem card 22, providing an acoustic feedback signal to the computer user to indicate that the modem card 22 and access arrangement 24 have been locked together. The ledge 230 contacts the shelf 236, preventing disengagement, unless the button 224 is pressed in the direction of the arrow 237 in FIG. 9.

The latch mechanism 220 firmly, but releasably, holds the access arrangement 24 and modem card 22 together. The two interface units do not release from each other unless the latch mechanism 220 is manually released, as shown in FIG. 9. Thus, after the access arrangement 24 has been interconnected to the modem card 22 and the modem card 22 has been inserted into the computer 26, both the access arrangement 24 and modem card 22 may be pulled away from the computer 26 simply by pulling the access arrangement 24. Unless the latch mechanism 220 is released, the modem card 22 will naturally be pulled away from the computer 26 along the access arrangement 24.

The guide assembly 202, cooperatively defined by the access arrangement 24 and modem card 22, assists a computer user in properly aligning the connectors 34, 106 of the modem card 22 and access arrangement 24 for a good connection between the two interface units. In the preferred embodiment, the guide assembly 202 includes first and second elongate guide pins 238, 240 extending from the access arrangement 24, which are matingly received by corresponding first and second apertures 242, 244 in the frame 204 of the modem card 22.

The latch mechanism 220 and guide assembly 202 lend structural support to maintain the interconnection between the two interface units. Unless the latch mechanism 220 is released and the access arrangement is pulled from the modem card along a plane defined by the two guide pins 238, 240 of the guide assembly 202, the access arrangement 24 will tend not to disengage from the modem card 22, even if force is applied to the access arrangement 24 from any direction or along any axis.

A preferred embodiment of the present invention is described herein. It is to be understood, of course, that changes and modifications may be made in the embodiment without departing from the true scope and spirit of the present invention as defined by the appended claims.

We claim:

1. A construction for first and second interface units, said units including an electronic card and an interface module, said electronic card and interface module defining a common side, comprising, in combination:

a connector on said first interface unit, said connector including first and second rows of contacts, said first row of contacts being in a sequence of 1, 2 . . . N, starting from said common side, said second row of contacts being in a sequence of N, N-1, . . . 1, starting from said common side, said contacts having similar designations being electrically interconnected;

a connector on said second interface unit, said connector including first and second rows of complimentary contacts, said first row of contacts being in a sequence of 1, 2 . . . N, starting from said common side, said second row of contacts being in a sequence of N, N-1 . . . 1, starting from said common side, said contacts having similar designations being electrically interconnected;

guide means cooperatively defined by:
a pair of elongate guide pins extending from one of said interface units, and
a pair of corresponding guide apertures, within another of said interface units, for receiving said guide pins; and a latch mechanism for releasably holding said units in a fixed relation, said latch mechanism including:
a catch protruding from one of said units, said catch including a wedge and a stem,
a spring for urging said catch toward a normal position, and
an aperture, within another of said units, to engagingly receive said catch, said aperture being adjacent a ledge,
said wedge of said catch engaging said ledge, as said units are pressed together, and urging said catch away from said normal position until said stem is substantially adjacent said ledge and said spring urges said stem against said ledge.

2. A construction for a pair of interface units, said units including an electronic card and an interface module, said electronic card and interface module defining a common side, comprising, in combination:

a connector on said first interface unit, said connector including first and second rows of contacts, said first row of contacts being in a sequence of 1, 2 . . . N, starting from said common side, said second row of contacts being in a sequence of N, N-1, . . . 1, starting from said common side, said contacts having similar designations being electrically interconnected;

a connector on said second interface unit, said connector including first and second rows of complimentary contacts, said first row of contacts being in a sequence of 1, 2 ... N, starting from said common side, said second row of contacts being in a sequence of N, N-1 ... 1, starting from said common side, said contacts having similar designations being electrically interconnected; and a latch mechanism for releasably holding said interface units in a fixed relation, said latch mechanism including:
- a catch protruding from one of said units, said catch including a wedge and a stem,
- a spring for urging said catch toward a normal position, and
- an aperture, within another of said units, to engagingly receive said catch, said aperture being adjacent a ledge,
- said wedge of said catch engaging said ledge, as said units are pressed together, and urging said catch away from said normal position until said stem is substantially adjacent said ledge and said spring urges said stem against said ledge.

3. A construction for first and second interface units, said interface units including an electronic card and an interface module, said electronic card and interface module defining a common side, comprising, in combination:

a connector on said first interface unit, said connector including first and second rows of contacts, said first row of contacts being in a sequence of 1, 2 ... N, starting from said common side, said second row of contacts being in a sequence of N, N-1, ... 1, starting from said common side, said contacts having similar designations being electrically interconnected;

a connector on said second interface unit, said connector including first and second rows of complimentary contacts, said first row of contacts being in a sequence of 1, 2 ... N, starting from said common side, said second row of contacts being ordered in a sequence of N, N-1 ... 1, starting from said common side, said contacts having similar designations being electrically interconnected; and guide means cooperatively defined by:
- a pair of elongate guide pins extending from one of said interface units, and
- a pair of corresponding guide apertures, within another of said interface units, for receiving said guide pins.

4. An interface construction for an electronic card and an interface module, said electronic card and interface module defining a common side, comprising, in combination:

a connector on said electronic card, said connector including first and second rows of complimentary contacts, said first row of contacts being in a sequence of 1, 2 . . . N, starting from said common side, said second row of contacts being ordered in a sequence of N, N-1 ... 1, starting from said common side, said contacts having similar designations being electrically interconnected; and a connector on said interface module, said connector including first and second rows of contacts, said first row of contacts being in a sequence of 1, 2 ... N, starting from said common side, said second row of contacts being ordered in a sequence of N, N-1, ... 1, starting from said common side, said contacts having similar designations being electrically interconnected, whereby risk of connecting said interface module and electronic card incorrectly is reduced.

* * * * *